United States Patent
Han et al.

(10) Patent No.: US 9,704,941 B2
(45) Date of Patent: Jul. 11, 2017

(54) ORGANIC LIGHT-EMITTING DISPLAY PANEL AND ORGANIC LIGHT-EMITTING DISPLAY DEVICE

(71) Applicants: Shanghai Tianma AM-OLED Co., Ltd., Shanghai (CN); TIANMA MICRO-ELECTRONICS CO., LTD., Shenzhen (CN)

(72) Inventors: Lijing Han, Shanghai (CN); Liyuan Luo, Shanghai (CN); Liujing Fan, Shanghai (CN)

(73) Assignees: SHANGHAI TIANMA AM-OLED CO., LTD., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 60 days.

(21) Appl. No.: 14/841,123

(22) Filed: Aug. 31, 2015

(65) Prior Publication Data

US 2016/0204186 A1    Jul. 14, 2016

(30) Foreign Application Priority Data

Jan. 12, 2015  (CN) .......................... 2014 1 0635190

(51) Int. Cl.
*H01L 27/32* (2006.01)
(52) U.S. Cl.
CPC ...... *H01L 27/3279* (2013.01); *H01L 27/3211* (2013.01); *H01L 2251/558* (2013.01)
(58) Field of Classification Search
None
See application file for complete search history.

(56) References Cited

U.S. PATENT DOCUMENTS

| | | | | |
|---|---|---|---|---|
| 6,903,378 B2* | 6/2005 | Cok | ..................... | H01L 27/3213 257/88 |
| 7,839,079 B2* | 11/2010 | Choi | ................... | H01L 27/3276 313/504 |
| 2008/0001875 A1* | 1/2008 | Yuuki | .................. | G09G 3/3233 345/87 |
| 2010/0277449 A1* | 11/2010 | Kanda | .................. | G09G 3/3233 345/206 |
| 2012/0056904 A1* | 3/2012 | Lhee | ..................... | G09G 3/3233 345/690 |

FOREIGN PATENT DOCUMENTS

| | | |
|---|---|---|
| CN | 101673016 A | 3/2010 |
| JP | 2004087302 A | 3/2004 |

OTHER PUBLICATIONS

1st Office Action as issued in corresponding Chinese Application No. 201410635190.4, dated May 26, 2016.

\* cited by examiner

*Primary Examiner* — Lex Malsawma
(74) *Attorney, Agent, or Firm* — Alston & Bird LLP

(57) ABSTRACT

An organic light-emitting display device/panel includes, in part, at least a red organic light-emitting element, a green organic light-emitting element and a blue organic light-emitting element. The organic light-emitting display device/panel optionally includes a white organic light-emitting element. The organic light-emitting display device/panel further includes, in part, a first power line coupled to the red organic light-emitting element, a second power line coupled to the green organic light-emitting element, and a third power line coupled to the blue organic light-emitting element. The power supplies a high voltage level to the organic light-emitting elements.

15 Claims, 5 Drawing Sheets

ORGANIC LIGHT-EMITTING DISPLAY PANEL AND ORGANIC LIGHT-EMITTING DISPLAY DEVICE

CROSS REFERENCE TO RELATED APPLICATIONS

The present application claims the priority of Chinese Patent Application No. 201410635190.4, entitled as "Organic light-emitting display panel and organic light-emitting display device," and filed with the Chinese Patent Office on Jan. 12, 2015, the content of which is incorporated herein by reference in its entirety.

FIELD OF THE INVENTION

The disclosure relates to the technical field of organic light-emitting display, and in particular to an organic light-emitting display panel and an organic light-emitting display device with reduced white color shift of white screens displayed under different luminance.

BACKGROUND OF THE INVENTION

An organic light-emitting display (OLED) device, which is also referred to as an organic electroluminesence display device, is characterized by self-luminous feature. The organic light-emitting display device employs a glass substrate, and a very thin organic material layer which is luminous when an electric current passes through it. The organic light-emitting display device has a wide viewing angle and can significantly save energy, and thereby the organic light-emitting display device has an unparalleled advantage over a conventional display device such as a liquid crystal display device.

In FIG. 1, a schematic diagram of an equivalent circuit of a pixel cell in the organic light-emitting display panel is shown. In FIG. 2, a schematic diagram of a conventional organic light-emitting display panel is shown.

As shown in FIG. 1, in the pixel cell, turning-on and turning-off of a thin film transistor M1 are controlled by a scanning signal scan. When M1 is turned on, a data signal data is transmitted to the gate of a thin film transistor M2 to control a current passing through M2. A power signal PVDD is transmitted through the thin film transistor M2 to a low potential end PVEE to control the luminescence of an organic light-emitting diode oled. The organic light-emitting diode oled is a current-driven device, where a current flowing through the organic light-emitting diode oled may be calculated by the following equation:

$$I_{oled} = \tfrac{1}{2} \times \mu \times C_{ox} \times W/L \times (PVDD - V_{data} - V_{th})^2,$$

where $\mu$ is the mobility of an active layer; $C_{ox}$ is the capacitance of a capacitor formed by the gate electrode and the active layer; W is the channel width of the organic light-emitting diode; L is the channel length of the organic light-emitting diode; $V_{data}$ is the voltage value of the data signal; $V_{th}$ is the threshold voltage value of the organic light-emitting diode; and PVDD is the voltage of the power signal.

The values for $\mu$, $C_{ox}$, W, L, and Vth are determined after the size of the organic light-emitting diode oled is determined. As can be seen from the above current equation, in a given oled device, a current flowing through the organic light-emitting diode oled is determined by the power signal PVDD and the data signal $V_{data}$.

Next, referring to FIG. 2, in the organic light-emitting display panel, multiple pixel cells arranged in a matrix are provided in a display region AA. A driving chip Driver IC and power driving chip Power IC are provided on a side of the organic light-emitting display panel. The Driver IC is configured for providing a scanning signal and the data signal to the multiple pixel cells. Generally, only one Power IC is provided in a small-sized organic light-emitting display panel. The Driver IC is provided on the organic light-emitting display panel. The Power IC is provided on a flexible circuit board or a printed circuit board.

The input voltage PVDD is provided by the Power IC to the multiple pixel cells through an input path P for driving the organic light-emitting diode oled for luminescence thereof. Power inputs for supplying voltage PVDD to the multiple pixel cells are connected together throughout the whole display region AA. The voltage may be reduced from a point AA1 which is closest to the Power IC to a point AA2 which is farthest from the Power IC, i.e., the voltage at the point AA1 is higher than the voltage at the point AA2 due to the fact that the organic light-emitting display panel is a current drive device and each pixel cell has resistance, which results in a voltage drop generated when the pixel cells are driven by the current.

The current flowing through the pixel cells decreases gradually with the gradually decreasing voltage from the closest point AA1 to the farthest point AA2, which results in a gradual decrease in the luminance of the organic light-emitting diode oled. In addition, different organic light-emitting diodes oleds have different resistances, and the same organic light-emitting diodes oled may exhibit different resistances when supplied with different driving currents. Therefore, when different organic light-emitting diodes oleds are connected to a power line, the power line varies in the reduction of the voltage, which leads to a difference in the reduction of the luminance of the organic light-emitting diode oled connected to the power line.

BRIEF SUMMARY OF THE INVENTION

In view of this, an organic light-emitting display panel and an organic light-emitting display device are provided according to the present disclosure.

An organic light-emitting display panel is provided, which includes: a plurality of organic light-emitting elements, including a red organic light-emitting element, a green organic light-emitting element and a blue organic light-emitting element, or including a red organic light-emitting element, a green organic light-emitting element, a blue organic light-emitting element and a white organic light-emitting element; and a plurality of power lines, where the red organic light-emitting element, the green organic light-emitting element and the blue organic light-emitting element are connected to different power lines respectively, and the plurality of power lines supply a high level (a current level, or voltage higher than the ground voltage) to the plurality of organic light-emitting elements respectively, where the power line connected to the red organic light-emitting element, the power line connected to the green organic light-emitting element and the power line connected to the blue organic light-emitting element have different line resistances.

An organic light-emitting display device is provided, which includes the above organic light-emitting display panel.

DETAILED DESCRIPTION OF THE INVENTION

In order to understand the technical solution of the disclosure, specific embodiments are taken and illustrated as follows in connection with the attached drawings. However the drawings and specific embodiments below are not intended to limit the disclosure, and some alterations and modifications may be made by those skilled in the art without departing from the spirit and scope of the disclosure. Therefore the scope of protection of the disclosure should be defined by the claims.

In the conventional art, an organic light-emitting display panel generally includes a red organic light-emitting diode, a green organic light-emitting diode and a blue organic light-emitting diode. Organic light-emitting display diodes with different colors have different voltage current characteristics. While the white screen of a display with different luminance may be graded into 64 levels or 256 levels of gray scale. A driving current for the organic light-emitting diode varies under different gray scales after Gamma adjustment and white balance adjustment are performed. Therefore, the luminance of different organic light-emitting diodes may be reduced by different levels under different gray scales.

Figure 1:
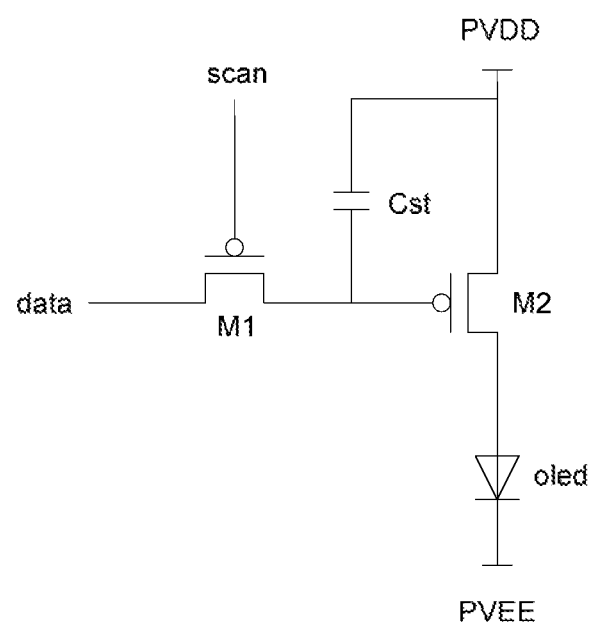
FIG. 1 is a schematic diagram of an equivalent circuit of one pixel cell in an organic light-emitting display panel.
Figure 2:
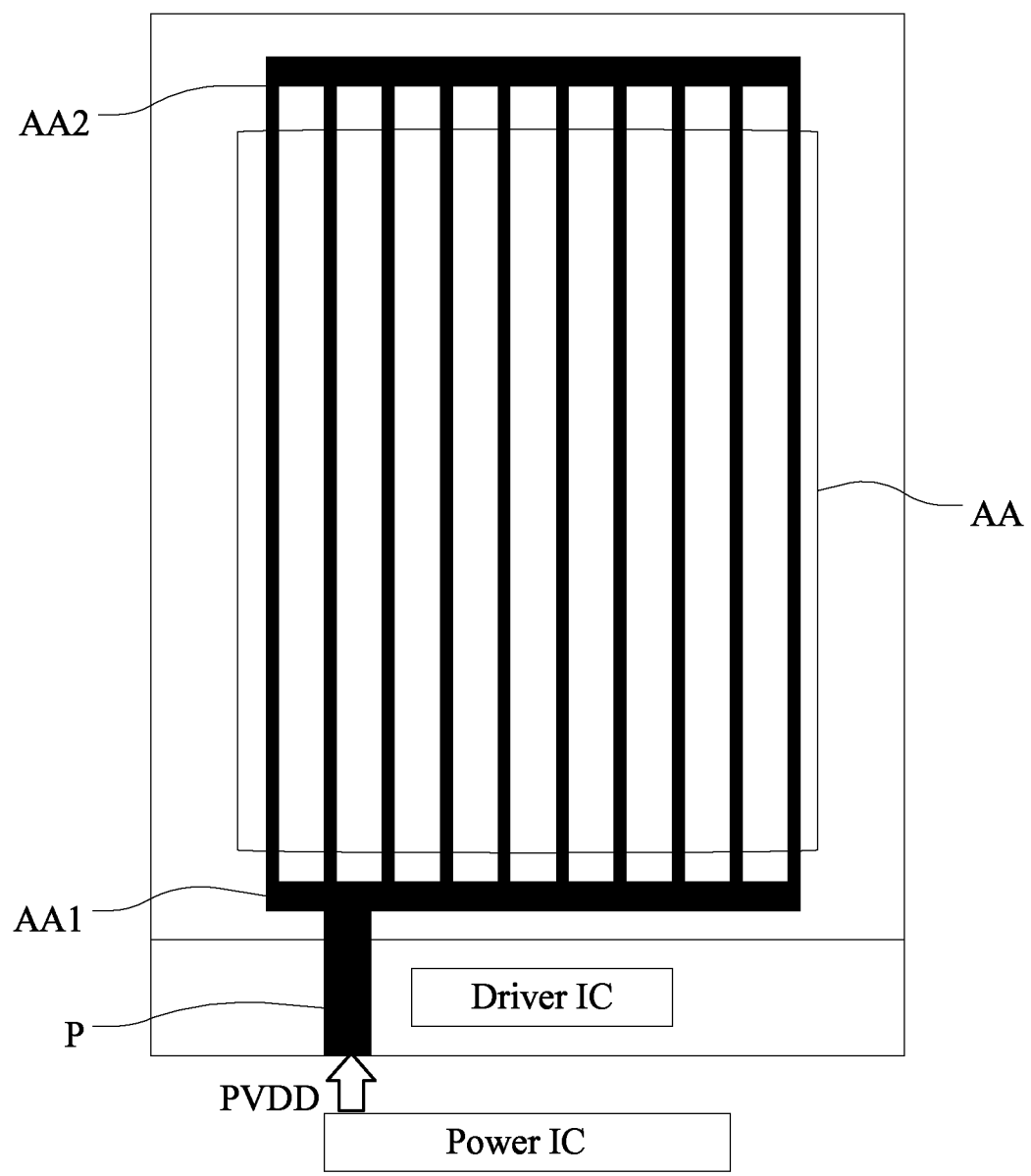
FIG. 2 is a schematic diagram of a conventional organic light-emitting display panel.
Figure 3:
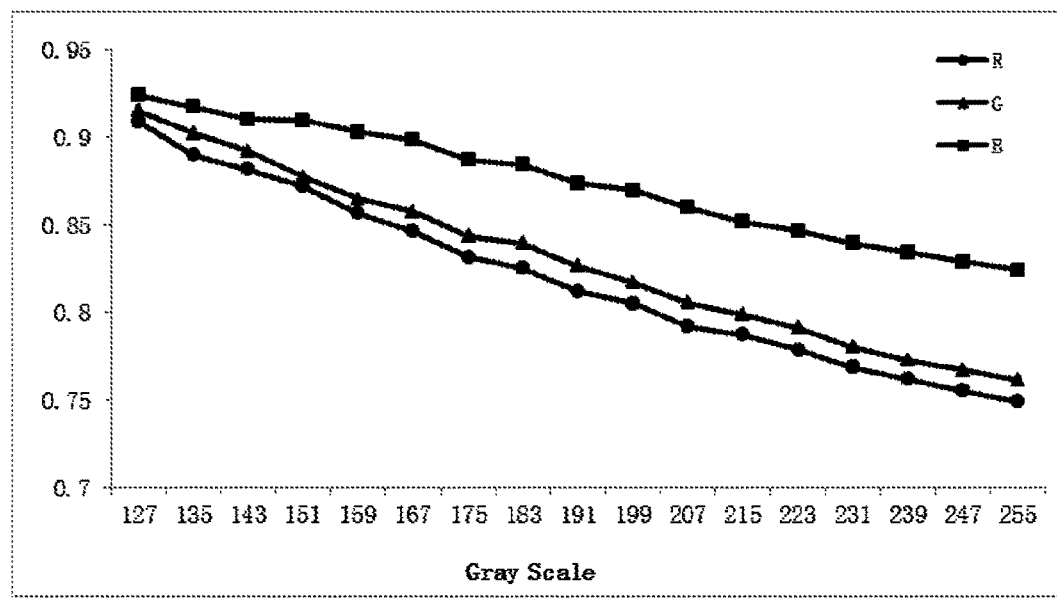
FIG. 3 is a trend chart of a ratio of the current at the input end to the current at the output end on the power line connected to a red organic light-emitting diode, the power line connected to a green organic light-emitting diode and the power line connected to a blue organic light-emitting diode under different gray scales.
Figure 4:
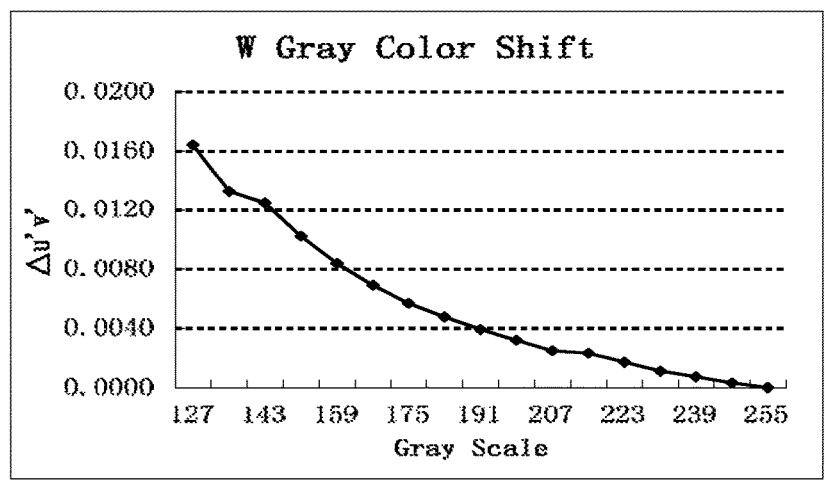
FIG. 4 illustrates a color shift of a white screen displayed by the organic light-emitting display panel under different gray scales.

When the organic light-emitting diodes of three colors are connected to power lines respectively, the differences in voltage drop among the organic light-emitting diodes in different colors will be accumulated, which may lead to different levels of luminance losses in the light emitted by organic light-emitting diodes in different colors when white screens under different gray scales are displayed. Reference is made to FIG. 3, which is a trend chart of a ratio of the current at the input end to the current at the output end on the power line connected to a red organic light-emitting diode, the power line connected to a green organic light-emitting diode and the power line connected to a blue organic light-emitting diode (hereinafter abbreviated as the red power line, the green power line and the blue power line) under different gray scales (where R represents the red power line, G represents the green power line, and B represents the blue power line). A larger ratio represents a smaller reduction in the current caused by the voltage drop. As can be seen from FIG. 3, with the increase of the luminance, power lines for different colors experience different degrees of voltage drop. The red power line suffers from the most serious voltage drop, which followed by the green power line. The trend of the ratio of output end current to input end current with respect to the luminance of the green power line is almost the same with that of the red power line. The voltage drop on the blue power line is relatively small and the trend of ratio of the output current to input current with respect to the luminance of the blue power line is more moderate. A white balance adjustment is generally performed on the white screen displayed by the organic light-emitting display with a peak luminance (here, at the gray scale of 255) to obtain a desired white color and determine the luminance of lights in different colors, and thereby determining the value of the drive current for the organic light-emitting diodes in different colors; based on this, the Gamma adjustment is further performed to determine values of drive currents for organic light-emitting diodes in different colors under different gray scales of the white screen. Since the light emission luminance of the organic light-emitting diode is proportional to the driving current value, and the proportions among drive current values for organic light-emitting diodes in different colors are identical under each gray scale (which ratio is referred to as a desired value), the difference in the voltage drop on power lines of different colors may lead to the difference between the actual value and the desired value of the proportion of drive current values for organic light-emitting diodes in different colors, i.e., the difference in the proportion of the luminance of the red light, the green light and the blue light when a white screen is displayed under different gray scales, thereby the white lights obtained after mixture are different, that is, have different coordinate values in the color coordinate. Reference is made to FIG. 4, which illustrates color shifts of a white screen displayed by the organic light-emitting display panel under different gray scales. Since generally the white balance adjustment is only performed on the white screen at a peak luminance (here, at the gray scale of 255), there is no color shift only in the white screen at a peak luminance (here, at the gray scale of 255) and color shift exists in the white screen at the rest of the gray scales, a small gray scale value (i.e. low luminance) corresponding to a large color shift between the white color actually displayed by the white screen and the desired white color, that is, a white screen may show different white colors at different luminance.

To reduce the color shift of the white screen, the proportion of the luminance of the red light, the luminance of the green light and the luminance of the blue light should be made identical under different gray scales. Although the voltage drop on the power line is inevitable, the voltage drop rate on the red power line, the green power line and the blue power line could be made as closer as possible under different gray scales such that the proportions of the luminance of the light emitted by the red light-emitting diode, the luminance of the green light-emitting diode and the luminance of the blue light-emitting diode tend to be identical in different gray scales, which may be implemented by adjusting the resistance of the red power line, the resistance of the green power line and the resistance of the blue power line.

The voltage drop on the power line of the organic light-emitting panel is related to the current driving the organic light-emitting diode. The present disclosure is adapted for the following organic light-emitting display panel: a drive current for the red organic light-emitting element ranges from 54.85 mA to 77.96 mA, a drive current for the green organic light-emitting element ranges from 73.25 mA to 78.14 mA, and a drive current for the blue organic light-emitting element ranges from 83.33 mA to 112.96 mA, when the organic light-emitting display panel displays a white screen with a peak luminance.

Figure 5:
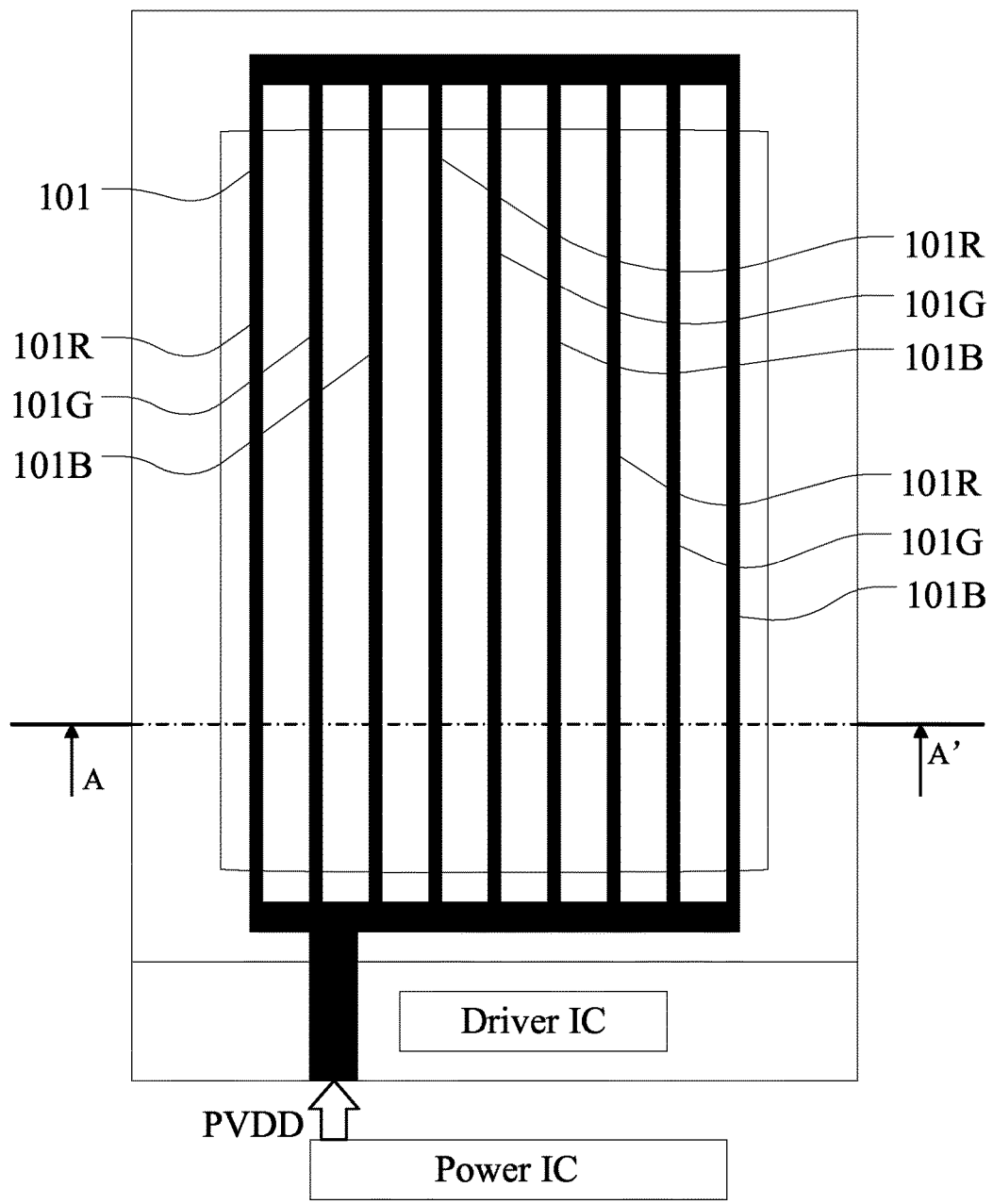
FIG. 5 is a schematic diagram of an organic light-emitting display panel according to a first embodiment of the present disclosure.

Reference is made to FIG. 5, which is a schematic diagram of an organic light-emitting display panel according to an embodiment of the present disclosure. As shown in FIG. 5, an organic light-emitting display panel is provided according to the present disclosure, which includes: multiple organic light-emitting elements not shown in FIG. 5; multiple power lines 101 for supplying a high level to the multiple organic light-emitting elements respectively. The organic light-emitting display panel may include a red organic light-emitting element, a green organic light-emitting element and a blue organic light-emitting element, or may include a red organic light-emitting element, a green organic light-emitting element, a blue organic light-emitting element and a white organic light-emitting element, where the each of red organic light-emitting element, the green organic light-emitting element and the blue organic light-emitting element is connected to a corresponding power line 101. The example in FIG. 5 includes nine power lines; the red light-emitting diodes are all connected to the red power line 101R, the green light-emitting diodes are all connected to the green power line 101G, and the blue light-emitting diodes are all connected to the blue power line 101B. The red power line 101R, the green power line 101G and the blue power line 101B are arranged cyclically with the red power line 101R, the green power line 101G and the blue power line 101B being in a certain sequence. In the case where the organic light-emitting display panel includes a white organic light-emitting diode, the white organic light-emitting diode may be connected to any one of the red power line 101R, the green power line 101G and the blue power line 101B, or the white organic light-emitting diode may be connected to an individual power line. The number of the power line and the order by which the power lines connected to the organic light-emitting diodes in different colors are arranged are not restricted in the present disclosure.

As can be seen from FIG. 3, in the conventional art, the current drop rate on the red power line and the green power line is larger than the power drop rate on the blue power line. Therefore, the current reduce rates on the red power line and the green power line should be reduced, which mainly depends on reducing the current consumption caused by the voltage drop, which may be implemented by reducing the resistance of the red power line and the resistance of the green power line.

The line resistance of the power line 101R connected to the red organic light-emitting element is 0.699 to 0.709 times as the line resistance of the power line 101B connected to the blue organic light-emitting element, and the line resistance of the power line 101G connected to the green organic light-emitting element is 0.741 to 0.763 times as the line resistance of the power line 101B connected to the blue organic light-emitting element.

The resistance of a line is calculated by the following equation (1):

$$R = \rho l/s \tag{1}$$

where $\rho$ is the resistivity, l is the length of the line, and s is the cross sectional area of the line.

The above mentioned line resistance (denoted as r) is defined as the resistance per unit length of a line, which may be expressed by the following equation (2):

$$r = R/l = \rho/s \tag{2}$$

Since the power line 101 has a approximately rectangular cross section, the area of which may be calculate by the product of the line width of the power line 101 (denoted as w) and the layer thickness (denoted as d), the equation for calculating the line resistance r may be further expressed by the following equation (3):

$$r = \rho/(w*d) \tag{3}$$

Figure 6:
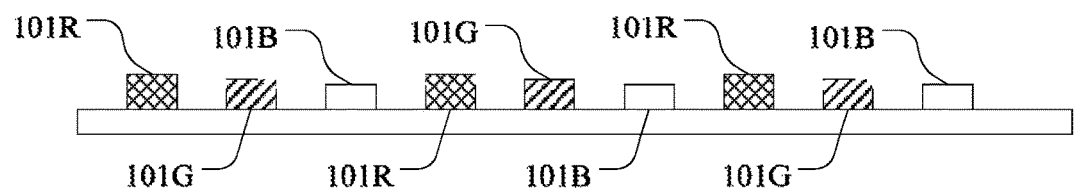
FIG. 6 is a schematic cross sectional view of the organic light-emitting display panel in FIG. 5 taken along direction of AA'.

Reference is made to FIG. 6, which is a schematic cross sectional view of the organic light-emitting display panel from FIG. 5 taken along direction of AA'. The red power line 101R, the green power line 101G and the blue power line 101B of the organic light-emitting display panel according to the present disclosure have the same resistivity $\rho$ and the same line width w, but have different layer thicknesses d, thereby the line resistance r of the red power line 101R, the green power line 101G and the blue power line 101B are made different from each other. It is known from equation (3), the line resistance r is inversely proportional to the layer thicknesses d of the power line 101 in the case where the power lines 101 has the same resistivity $\rho$ and the same line width w. Therefore, the relationship among layer widths d of power input lines for different colors is as follows.

The multiple power lines has the same resistivity and the same line width, the layer thickness of the power line connected to the red organic light-emitting element is 1.41 to 1.43 times of the layer thickness of the power line connected to the blue organic light-emitting element, and the layer thickness of the power line connected to the green organic light-emitting element is 1.31 to 1.35 times of the layer thickness of the power line connected to the blue organic light-emitting element.

Figure 7:
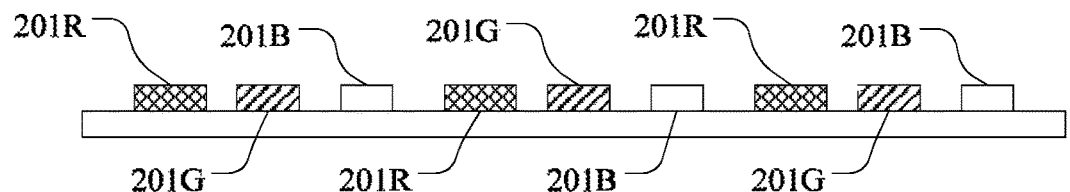
FIG. 7 is a schematic cross sectional view of an organic light-emitting display panel according to a second embodiment of the present disclosure.

Reference is made to FIG. 7, which is a schematic cross sectional view of an organic light-emitting display panel according to a second embodiment of the present disclosure. Only the cross section of the power line on the organic light-emitting display panel is illustrated in FIG. 7. The same part of the second embodiment with the first embodiment will be omitted. The second embodiment is also intended to achieve the following objectives: the line resistance r of the power line 201R connected to the red organic light-emitting element is 0.699 to 0.709 times as the line resistance r of the power line 201B connected to the blue organic light-emitting element, and the line resistance r of the power line 201G connected to the green organic light-emitting element is 0.741 to 0.763 times as the line resistance r of the power line 201B connected to the blue organic light-emitting element. According to the second embodiment of the present disclosure, the difference is that the red power line 201R, the green power line 201G and the blue power line 201B of the organic light-emitting display panel have the same resistivity $\rho$ and the same layer thickness d, but have different line widths w. It is known from equation (3) that the line resistance r is inversely proportional to the line width w of the power line in the case where the power lines 101 has the same resistivity $\rho$ and the same layer thickness d. Therefore, the relationship of the line widths w among power input lines for different colors is as follows.

The multiple power lines has the same resistivity $\rho$ and the same layer thickness d, the line width w of the power line 201R connected to the red organic light-emitting element is 1.41 to 1.43 times as the line width w of the power line 201B connected to the blue organic light-emitting element, and the line width w of the power line 201G connected to the green organic light-emitting element is 1.31 to 1.35 times of the line width w of the power line 201B connected to the blue organic light-emitting element.

Another implementation of the present disclosure is provided in a third embodiment. The same part of the third embodiment with the first embodiment will be omitted. The third embodiment is different from the first embodiment in that the multiple power lines has the same layer thickness d and the same line width w, but the red power line, the green power line and the blue power line have different resistivity ρ. The following objectives are to be achieved in the third embodiment: the line resistance r of the power line connected to the red organic light-emitting element is 0.699 to 0.709 times of the line resistance r of the power line connected to the blue organic light-emitting element, and the line resistance r of the power line connected to the green organic light-emitting element is 0.741 to 0.763 times of the line resistance r of the power line connected to the blue organic light-emitting element.

According to the third embodiment, the red power line, the green power line and the blue power line of the organic light-emitting have the same layer thickness d and the same line width w, but have different resistivity ρ. It is known from equation (3) that the line resistance r is directly proportional to the resistivity ρ of the power line in the case where the multiple power lines has the same thickness d and the same line width w. Therefore, the relationship of the resistivity ρ among power input lines for different colors is as follows.

The resistivity ρ of the power line connected to the red organic light-emitting element is 0.699 to 0.709 times of the resistivity ρ of the power line connected to the blue organic light-emitting element, and the resistivity ρ of the power line connected to the green organic light-emitting element is 0.741 to 0.763 times of the resistivity ρ of the power line connected to the blue organic light-emitting element.

Several methods may be adopted to implement the difference in the resistivity ρ between the red power line, the green power line and the blue power line. For example, the power line connected to the red organic light-emitting element, the power line connected to the green organic light-emitting element and the power line connected to the blue organic light-emitting element may be made from different materials. The power line of the organic light-emitting display panel is generally made from metal such as aluminum, and may also be made from metals with low resistivity, such as copper, silver or other conductors to reduce the resistance of the red power line and the green power line.

In yet another embodiment, the power line connected to the red organic light-emitting element may have a multi-layer structure, and thereby the resistivity ρ of the power line connected to the red organic light-emitting element is 0.699 to 0.709 times of the resistivity ρ of the power line connected to the blue organic light-emitting element. For example, in addition to the conventional material for the power line such as aluminum, a layer of conductive material with relatively small resistivity may be added to reduce the resistance of the red power line.

Preferably, the power line connected to the red organic light-emitting element has a two-layer structure, which includes a first layer identical to the power line connected to the blue organic light-emitting element and a second layer made from metal or transparent conductive material, the second layer may be above or below the first layer. The advantage is that one of the two layers of the red power line may be formed simultaneously with the blue power line, and thereby the fabrication procedure is simplified. Therefore, the two-layer structure of the red power line may be formed by adding a layer of other material with relatively small resistivity, i.e., metal such as copper and silver, or other conductor with relatively small resistivity, on the conventional material layer such as the aluminum layer.

Similarly, in still another embodiment, the power line connected to the green organic light-emitting element may have a multi-layer structure, and thereby the resistivity ρ of the power line connected to the green organic light-emitting element is 0.741 to 0.763 times of the resistivity ρ of the power line connected to the blue organic light-emitting element. For example, in addition to the conventional material for the power line such as aluminum, a layer of conductive material with relatively small resistivity may be added to reduce the resistance of the green power line.

Preferably, the power line connected to the green organic light-emitting element has a two-layer structure, which includes a first layer identical to the power line connected to the blue organic light-emitting element and a second layer made from metal or transparent conductive material, and the second layer may be above or below the first layer. The advantage is that one of the two layers of the green power line may be formed simultaneously with the blue power line, and thereby the fabrication procedure is simplified. Therefore, the two-layer structure of the green power line may be formed by adding a layer of other material with relatively small resistivity, i.e., metal such as copper and silver, or other conductor with relatively small resistivity, on the conventional material layer such as the aluminum layer.

The present disclosure is not limited to above embodiments, and the above embodiments may also be implemented in combination. The adjustment of the layer thickness, the line width, the resistivity and the layer structure of the red power line, the green power line and the blue power line may be performed in combination to achieve a desired resistance for power lines for different colors.

The organic light-emitting display panel according to the present disclosure may be used to manufacture the organic light-emitting display device, such as the organic light-emitting display device which adopts the organic display panel according to the present disclosure.

What is claimed is:

1. An organic light-emitting display panel, comprising:
   a plurality of organic light-emitting elements, comprising a red organic light-emitting element, a green organic light-emitting element and a blue organic light-emitting element; and
   a first power line supplying a first current to the red organic light-emitting element, a second power line supplying a second current to the green organic light-emitting element, and a third power line supplying a third current to the blue organic light-emitting element,
   wherein the first power line, the second power line, and the third power line each have different line resistances, and line resistances of the first and second power lines are smaller than a line resistance of the third power line.

2. The organic light-emitting display panel of claim 1, wherein the first power line, the second power line, and the third power line have different line widths, or have different layer thicknesses, or have different resistivity.

3. The organic light-emitting display panel of claim 1, wherein the first current ranges from 54.85 mA to 77.96 mA, the second current ranges from 73.25 mA to 78.14 mA, and the third current ranges from 83.33 mA to 112.96 mA, when the organic light-emitting display panel displays a white screen with a peak luminance.

4. The organic light-emitting display panel of claim 1, wherein the line resistance of the first power line is 0.699 to 0.709 times as the line resistance of the third power line, and the line resistance of the second power line is 0.741 to 0.763 times of the line resistance of the third power line.

5. The organic light-emitting display panel of claim 4, wherein the first, second, and third power lines have the same resistivity and the same line width, the layer thickness of the first power line is 1.41 to 1.43 times of the layer thickness of the third power line, and the layer thickness of the second power line is 1.31 to 1.35 times of the layer thickness of the third power line.

6. The organic light-emitting display panel of claim 4, wherein the first, second, and third power lines have the same resistivity and the same layer thickness, the line width of the first power line is 1.41 to 1.43 times of the line width of the third power line, and the line width of the second power line is 1.31 to 1.35 times of the line width of the third power line.

7. The organic light-emitting display panel of claim 4, wherein the first, second, and third power lines have the same layer thickness and the same line width, the resistivity of the first power line is 0.699 to 0.709 times of the resistivity of the third power line, and the resistivity of the second power line is 0.741 to 0.763 times of the resistivity of the third power line.

8. The organic light-emitting display panel of claim 7, wherein the power line connected to the red organic light-emitting element, the power line connected to the green organic light-emitting element and the power line connected to the blue organic light-emitting element are each made from different materials.

9. The organic light-emitting display panel of claim 4, wherein the power line connected to the red organic light-emitting element has a multi-layer structure.

10. The organic light-emitting display panel of claim 9, wherein the first power line has a two-layer structure, which comprises a first layer identical to the third power line and a second layer made from metal or transparent conductive material, and the second layer is located above or below the first layer.

11. The organic light-emitting display panel of claim 4, wherein the second power line has a multi-layer structure.

12. The organic light-emitting display panel of claim 11, wherein the second power line has a two-layer structure, which comprises a first layer identical to the third power line and a second layer made from metal or transparent conductive material, and the second layer is located above or below the first layer.

13. The display panel of claim 1, wherein the plurality of organic light-emitting elements further comprises a white organic light-emitting element.

14. An organic light-emitting display device, comprising:
an organic light-emitting display panel, the display panel comprising:
a plurality of organic light-emitting elements, comprising a red organic light-emitting element, a green organic light-emitting element and a blue organic light-emitting element; and
a first power line supplying a first current to the red organic light-emitting element, a second power line supplying a second current to the green organic light-emitting element, and a third power line supplying a third current to the blue organic light-emitting element,
wherein the first power line, the second power line, and the third power line each have different line resistances, and line resistances of the first and second power lines are smaller than a line resistance of the third power line.

15. The display device of claim 14, wherein the plurality of organic light-emitting elements further comprises a white organic light-emitting element.

* * * * *